(12) United States Patent
Sriram et al.

(10) Patent No.: US 10,861,963 B2
(45) Date of Patent: Dec. 8, 2020

(54) MONOLITHIC MICROWAVE INTEGRATED CIRCUITS HAVING BOTH ENHANCEMENT-MODE AND DEPLETION MODE TRANSISTORS

(71) Applicant: Cree, Inc., Durham, NC (US)

(72) Inventors: Saptharishi Sriram, Cary, NC (US); Jennifer Qingzhu Gao, Raleigh, NC (US); Jeremy Fisher, Raleigh, NC (US); Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/663,843

(22) Filed: Oct. 25, 2019

(65) Prior Publication Data

US 2020/0066892 A1    Feb. 27, 2020

Related U.S. Application Data

(63) Continuation of application No. 16/039,370, filed on Jul. 19, 2018, now Pat. No. 10,516,043.

(51) Int. Cl.
*H01L 29/778* (2006.01)
*H01L 29/66* (2006.01)
(Continued)

(52) U.S. Cl.
CPC ...... *H01L 29/7787* (2013.01); *H01L 29/2003* (2013.01); *H01L 29/66462* (2013.01);
(Continued)

(58) Field of Classification Search
CPC ............. H01L 29/7787; H01L 29/2003; H01L 29/66462; H03F 1/0261; H03F 3/1935; H03F 3/21; H03F 2200/451
(Continued)

(56) References Cited

U.S. PATENT DOCUMENTS 7,321,132 B2    1/2008 Robinson et al.
8,592,868 B2 *  11/2013 Heikman ............ H01L 29/7787
                                                                257/194

(Continued)

FOREIGN PATENT DOCUMENTS

WO    2011/011261 A2    1/2011

OTHER PUBLICATIONS

Luo Weijun et al., "High-Power X-Band 5-B GaN Phase Shifter with Monolithic Integrated E/D HEMTs Control Logic," IEEE Transactions on Electron Devices, IEEE Service Center, Pisacatawy, NJ, vol. 64, No. 9, Sep. 2017.

(Continued)

*Primary Examiner* — Tu-Tu V Ho
(74) *Attorney, Agent, or Firm* — Myers Bigel, P.A.

(57) ABSTRACT

A gallium nitride based monolithic microwave integrated circuit includes a substrate, a channel layer on the substrate and a barrier layer on the channel layer. A recess is provided in a top surface of the barrier layer. First gate, source and drain electrodes are provided on the barrier layer opposite the channel layer, with a bottom surface of the first gate electrode in direct contact with the barrier layer. Second gate, source and drain electrodes are also provided on the barrier layer opposite the channel layer. A gate insulating layer is provided in the recess in the barrier layer, and the second gate electrode is on the gate insulating layer opposite the barrier layer and extending into the recess. The first gate, source and drain electrodes comprise the electrodes of a depletion mode transistor, and the second gate, source and drain electrodes comprise the electrodes of an enhancement mode transistor.

20 Claims, 4 Drawing Sheets

(51) Int. Cl.
  *H01L 29/20* (2006.01)
  *H03F 1/02* (2006.01)
  *H03F 3/193* (2006.01)
  *H03F 3/21* (2006.01)

(52) U.S. Cl.
  CPC ......... *H03F 1/0261* (2013.01); *H03F 3/1935* (2013.01); *H03F 3/21* (2013.01); *H03F 2200/451* (2013.01)

(58) Field of Classification Search
  USPC .......................................................... 257/194
  See application file for complete search history.

(56) References Cited

U.S. PATENT DOCUMENTS

| | | |
|---|---|---|
| 8,933,461 B2 | 1/2015 | Pendharkar et al. |
| 9,148,092 B1 | 9/2015 | Brown et al. |
| 9,595,928 B2 | 3/2017 | Schmukler |
| 2006/0208279 A1 | 9/2006 | Robinson et al. |
| 2007/0228416 A1 | 10/2007 | Chen et al. |
| 2011/0309372 A1 | 12/2011 | Xin et al. |
| 2014/0042452 A1 | 2/2014 | Pendharkar et al. |
| 2014/0264379 A1 | 9/2014 | Kub et al. |
| 2014/0333382 A1 | 11/2014 | Lautzenhiser |
| 2016/0104703 A1 | 4/2016 | Parke et al. |
| 2017/0373179 A1 | 12/2017 | Sriram et al. |

OTHER PUBLICATIONS

Jiang Qimeng et al., "A High-Voltage Low-Standby-Power Startup Circuit Using Monolithically Inteegrated E/D-Mode AlGaN/GaN MIS-HeMTs," IEEE Transactions on Electron Devices, IEEE Service Center, Pisacataway, NJ, vol. 61, No. 3, Mar. 2014.

Notification of Transmittal of the International Search Report and the Written Opinion of the International Searching Authority, or the Declaration, corresponding to PCT/US2019/032105, dated Oct. 15, 2019.

Bentini et al., Design and Realization of GaAs Digital Circuit for Mixed Signal MMIC Implemenation in AESA Application, International Journal of Microwave Science and Technology, vol. 2011, Article ID 387137, 11 pages, (2011).

Jhih-Han Du et al., "The Demonstration of Enhancement/Depletion-Mode pHEMT Technology with Optimized E-Moe Characteristics for Better Yield," CS ManTech Conference, May 16-19, 2011, Palm Springs, CA.

* cited by examiner

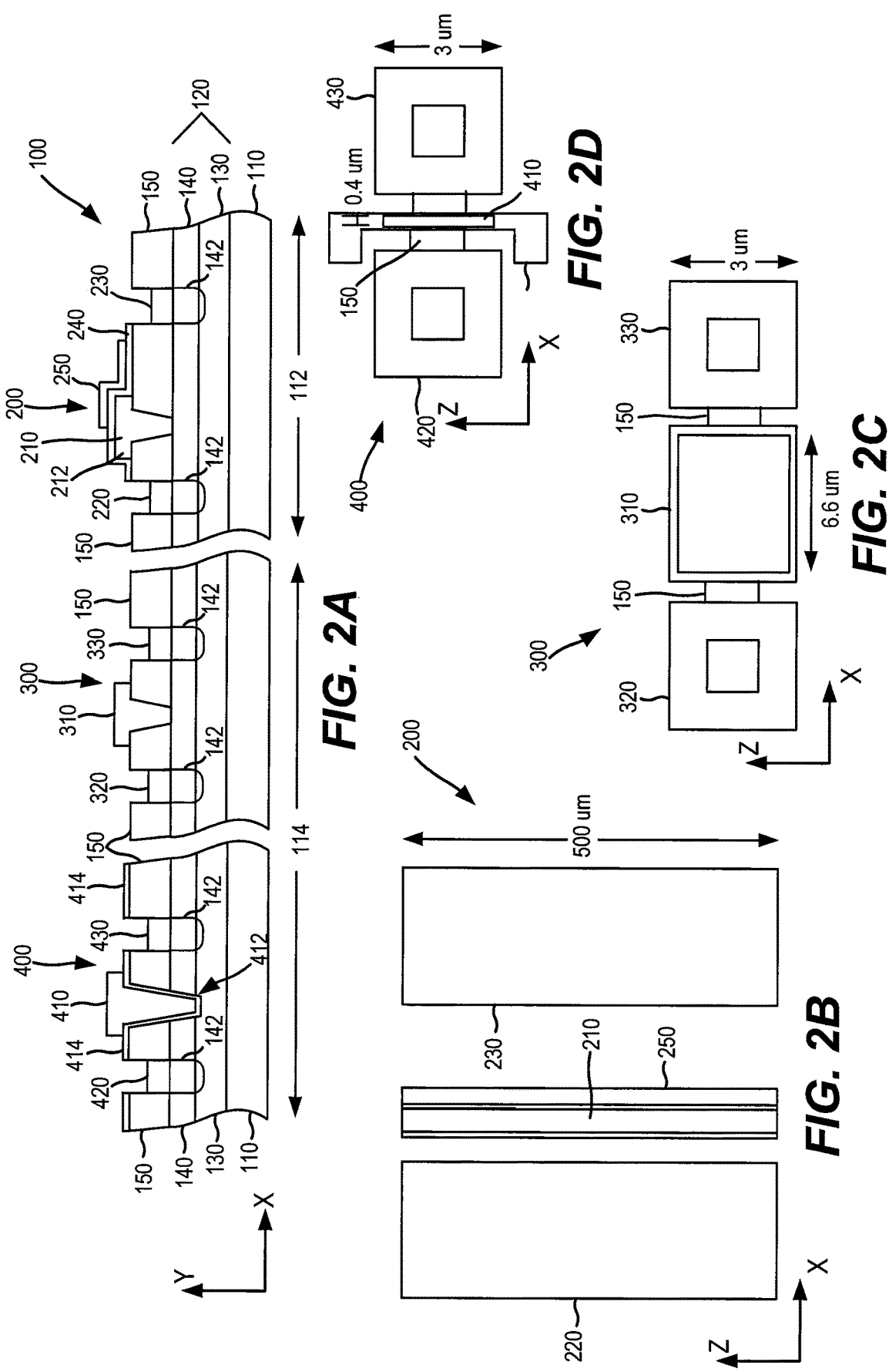

MONOLITHIC MICROWAVE INTEGRATED CIRCUITS HAVING BOTH ENHANCEMENT-MODE AND DEPLETION MODE TRANSISTORS

CROSS-REFERENCE TO RELATED APPLICATION

The present application is a continuation of U.S. patent application Ser. No. 16/039,370, filed Jul. 19, 2018, the entire content of which is incorporated herein by reference.

STATEMENT OF U.S. GOVERNMENT INTEREST

This invention was made with Government support under Contract No. 11-D-5309 awarded by the Department of Defense. The Government has certain rights in the invention.

FIELD

The inventive concepts described herein relate to integrated circuit devices and, more particularly, to monolithic microwave integrated circuits.

BACKGROUND

Power semiconductor devices are widely used to carry large currents, support high voltages and/or operate at high frequencies such as radio frequencies. A wide variety of power semiconductor devices are known in the art including, for example, power switching devices and power amplifiers. Many power semiconductor devices are implemented using various types of Field Effect Transistors including, for example, High Electron Mobility Transistors (HEMT) and Metal Oxide Semiconductor Field Effect Transistors (MOSFETs).

Modern power semiconductor devices are generally fabricated from wide bandgap semiconductor materials. For example, power HEMTs may be fabricated from gallium arsenide (GaAs) based material systems or, more recently, from gallium nitride (GaN) based material systems that are formed on a silicon carbide (SiC) substrate. Power semiconductor devices may be formed as discrete devices or as a plurality of devices (which may include transistors and other circuit devices such as resistors, inductors, capacitors, transmission lines and the like) that are formed on a common substrate to provide a so-called Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Field effect transistors such as HEMTs and MOSFETs may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. HEMTs are typically implemented as depletion mode devices, in that they are conductive at a gate-source bias of zero due to the polarization-induced charge at the interface of the barrier and channel layers of the device.

SUMMARY

Pursuant to embodiments of the present invention, MMIC devices are provided that include a monolithic substrate, a gallium nitride based channel layer on the monolithic substrate and a gallium nitride based barrier layer on the gallium nitride based channel layer opposite the monolithic substrate, the gallium nitride based barrier layer including a recess in a top surface thereof. A first source electrode, a first drain electrode and a first gate electrode are provided on the gallium nitride based barrier layer opposite the gallium nitride based channel layer, the first gate electrode positioned between the first source electrode and the first drain electrode with a bottom surface of the first gate electrode in direct contact with the gallium nitride based barrier layer. A second source electrode and a second drain electrode are also provided on the gallium nitride based barrier layer opposite the gallium nitride based channel layer. A gate insulating layer is in the recess in the gallium nitride based barrier layer, and a second gate electrode is on the gate insulating layer opposite the gallium nitride based barrier layer, the second gate electrode positioned between the second source electrode and the second drain electrode and extending into the recess. The first source electrode, the first drain electrode and the first gate electrode comprise electrodes of a depletion mode transistor, and the second source electrode, the second drain electrode and the second gate electrode comprise electrodes of an enhancement mode transistor.

In some embodiments, the recess extends completely through the gallium nitride based barrier layer to expose the gallium nitride based channel layer. The recess may optionally further extend into a top surface of the gallium nitride based channel layer.

In some embodiments, the MMIC device may further include a third source electrode, a third drain electrode and a third gate electrode on the gallium nitride based barrier layer opposite the gallium nitride based channel layer, the third gate electrode extending between the third source electrode and the third drain electrode with a bottom surface of the third gate electrode in direct contact with the barrier layer. In such embodiments, the depletion mode transistor may be a first depletion mode transistor, and the third source electrode, the third drain electrode and the third gate electrode may be the electrodes of a second depletion mode transistor.

In some embodiments, a first distance between the second source electrode and the second gate electrode may be substantially the same as a second distance between the second drain electrode and the second gate electrode. In some embodiments, a third distance between the first source electrode and the first gate electrode may be less than a fourth distance between the first drain electrode and the first gate electrode.

In some embodiments, the MMIC device may further include an insulating layer on the gallium nitride based barrier layer that has openings for each of the first and second source electrodes, the first and second drain electrodes and the first and second gate electrodes. In such embodiments, the insulating layer and the gate insulating layer may be formed of different materials, and the gate insulating layer may extend along a top surface of at least a portion of the insulating layer and along sidewalls of the opening in the insulating layer for the second gate electrode.

In some embodiments, the gate insulating layer may be an oxide layer and the insulating layer may be a nitride layer.

In some embodiments, the depletion mode transistor may include a field plate and the enhancement mode transistor does not include a field plate.

Pursuant to further embodiments of the present invention, semiconductor integrated circuits are provided that include a substrate, a radio frequency (RF) power amplifier formed on a first region of the substrate, the RF power amplifier including a plurality of gallium nitride based depletion mode transistors and a digital circuit formed on a second region of the substrate, the digital circuit including a plurality of gallium nitride based enhancement mode transistors.

In some embodiments, the digital circuit may further include a plurality of gallium nitride based depletion mode transistors.

In some embodiments, the semiconductor integrated circuit may further include a gallium nitride based channel layer on the substrate and a gallium nitride based barrier layer on the gallium nitride based channel layer opposite the substrate, the gallium nitride based barrier layer including a plurality of recesses in a top surface thereof. The gate electrodes of the gallium nitride based depletion mode transistors in the first region of the substrate may directly contact the gallium nitride based barrier layer, and the gate electrodes of the gallium nitride based enhancement mode transistors in the second region of the substrate may extend into the respective recesses in the gallium nitride based barrier layer.

In some embodiments, the semiconductor integrated circuit may further include a gate insulating layer in the recesses in the gallium nitride based barrier layer between the gallium nitride based barrier layer and the respective gate electrodes of the gallium nitride based enhancement mode transistors.

In some embodiments, the recesses extend completely through the gallium nitride based barrier layer to expose the gallium nitride based channel layer.

In some embodiments, the recesses further extend into a top surface of the gallium nitride based channel layer.

In some embodiments, the gate insulating layer comprises an oxide layer.

In some embodiments, the recesses only extend part of the way through the gallium nitride based barrier layer, and wherein the gate electrodes of the gallium nitride based enhancement mode transistors in the second region of the substrate directly contact respective portions of the gallium nitride based barrier layer.

In some embodiments, each gallium nitride based enhancement mode transistor includes a gate electrode, a source electrode and a drain electrode, and wherein the gate electrode of each gallium nitride based enhancement mode transistor is equidistant between its corresponding source and drain electrodes.

In some embodiments, each gallium nitride based depletion mode transistor includes a gate electrode, a source electrode and a drain electrode, and wherein the gate electrode of each gallium nitride based depletion mode transistor is closer to its corresponding source electrode than it is to its corresponding drain electrode.

In some embodiments, the semiconductor integrated circuit may further include a gallium nitride based channel layer on the substrate and a gallium nitride based barrier layer on the gallium nitride based channel layer opposite the substrate, where each gallium nitride based enhancement mode transistor includes a gate electrode, a source electrode and a drain electrode, and the gallium nitride based barrier layer is doped with first conductivity type dopants under the source and drain electrodes of each gallium nitride based enhancement mode transistor, and the gallium nitride based barrier layer is doped with second conductivity type dopants under the gate electrodes of each gallium nitride based enhancement mode transistor, wherein the first conductivity type is opposite the second conductivity type.

Pursuant to yet further embodiments of the present invention, semiconductor integrated circuits are provided that include a monolithic substrate, a first gallium nitride based depletion mode transistor on a first region of the monolithic substrate, the first gallium nitride based depletion mode transistor having a first gate width and a first gate length, a second gallium nitride based depletion mode transistor on a second region of the monolithic substrate, the second gallium nitride based depletion mode transistor having a second gate width and a second gate length and a gallium nitride based enhancement mode transistor on the second region of the monolithic substrate, the gallium nitride based enhancement mode transistor having a third gate width and a third gate length.

In some embodiments, the first gate width exceeds the second gate width by at least a factor of ten.

In some embodiments, the first gate length is less than the second gate length.

In some embodiments, the first gate width exceeds the third gate width by at least a factor of ten.

In some embodiments, the first gate length is less than the third gate length.

In some embodiments, the second gate length exceeds the third gate length.

In some embodiments, the semiconductor integrated circuit may further include a gallium nitride based channel layer on the monolithic substrate and a gallium nitride based barrier layer on the gallium nitride based channel layer opposite the monolithic substrate, a top surface of the gallium nitride based barrier layer including a recess. In such embodiments, a gate electrode of the first gallium nitride based depletion mode transistor and a gate electrode of the second gallium nitride based depletion mode transistor may each directly contact the gallium nitride based barrier layer, and a gate electrode of the gallium nitride based enhancement mode transistor extends into the recess in the gallium nitride based barrier layer.

In some embodiments, the semiconductor integrated circuit may further include a gate insulating layer in the recess in the gallium nitride based barrier layer between the gallium nitride based barrier layer and the gate electrode of the gallium nitride based enhancement mode transistor.

In some embodiments, the recess extends completely through the gallium nitride based barrier layer to expose the gallium nitride based channel layer.

In some embodiments, the recess further extends into a top surface of the gallium nitride based channel layer.

In some embodiments, the gate insulating layer comprises an oxide layer.

In some embodiments, the recess only extends part of the way through the gallium nitride based barrier layer, and wherein the gate electrode of the gallium nitride based enhancement mode transistor directly contacts sidewalls and a bottom surface of the recess.

In some embodiments, the semiconductor integrated circuit may further include a gallium nitride based channel layer on the monolithic semiconductor substrate and a gallium nitride based barrier layer on the gallium nitride based channel layer opposite the monolithic semiconductor substrate. In such embodiments, the gallium nitride based enhancement mode transistor may include a gate electrode, a source electrode and a drain electrode and the gallium nitride based barrier layer may be doped with first conductivity type dopants under the source and drain electrodes of the gallium nitride based enhancement mode transistor, and the gallium nitride based barrier layer may be doped with second conductivity type dopants under the gate electrode of the gallium nitride based enhancement mode transistor, where the first conductivity type is opposite the second conductivity type.

Pursuant to additional embodiments of the present invention, methods of fabricating a gallium nitride based monolithic microwave integrated circuit device are provided in which a gallium nitride based channel layer is formed on a substrate. A gallium nitride based barrier layer is formed on the gallium nitride based channel layer opposite the substrate. An insulating layer is formed on the gallium nitride based barrier layer, the insulating layer including a plurality of first gate electrode openings that expose the gallium nitride based barrier layer, a plurality of second gate electrode openings that expose the gallium nitride based barrier layer and a plurality of source/drain electrode openings that expose the gallium nitride based barrier layer. Recesses are formed in respective portions of the gallium nitride based barrier layer that are exposed by the first gate electrode openings. A gate insulating layer is formed in the first gate electrode openings, the gate insulating layer covering sidewalls and bottom surfaces of the respective recesses. A plurality of first source electrodes, a plurality of second source electrodes, a plurality of first drain electrodes and a plurality of second drain electrodes are formed in the source/drain electrode openings in the insulating layer, the first source electrodes, the second source electrodes, the first drain electrodes and the second drain electrodes directly contacting a top surface of the gallium nitride based barrier layer. First gate electrodes are formed in the first gate electrode openings on the gate insulating layer, each first gate electrode extending into a respective one of the recesses. Second gate electrodes are formed in second gate electrode openings in the insulating layer, the second gate electrodes directly contacting a top surface of the gallium nitride based barrier layer. Each set of a first source electrode, a first drain electrode and a first gate electrode comprises the electrodes of an enhancement mode transistor, and each set of a second source electrode, a second drain electrode and a second gate electrode comprises the electrodes of a depletion mode transistor.

BRIEF DESCRIPTION OF THE DRAWINGS

FIG. 2A is a schematic cross-sectional view of three regions of a gallium nitride based MMIC device according to embodiments of the present invention that includes both depletion-mode and enhancement mode transistors.

FIGS. 2B-2D are schematic plan views corresponding to the three cross-sectional regions illustrated in FIG. 2A.

DETAILED DESCRIPTION

Gallium nitride based power semiconductor devices such as gallium nitride based HEMT devices are very promising candidates for high power RF applications such as high power amplifiers used in radio communications systems, radar and various other wireless applications. As used herein, the term "gallium nitride based" refers to those semiconducting compounds that include at least gallium and nitrogen, including gallium nitride as well as ternary and quaternary compounds such as aluminum gallium nitride (AlGaN) and aluminum indium gallium nitride (AlInGaN). Gallium nitride based power semiconductor devices have been developed as both discrete devices that are coupled with other circuitry such as, for example, impedance matching networks, or as MMIC devices (e.g., a multi-stage HEMT amplifier with built-in impedance matching networks). In many applications, the gallium nitride based power semiconductor devices are controlled by control signals. Typically, commercially available digital circuits are used to generate the control signals that are supplied to a gallium nitride based power semiconductor device. These digital circuits may comprise one or more additional semiconductor chips, and are typically silicon-based semiconductor devices.

Figure 1:
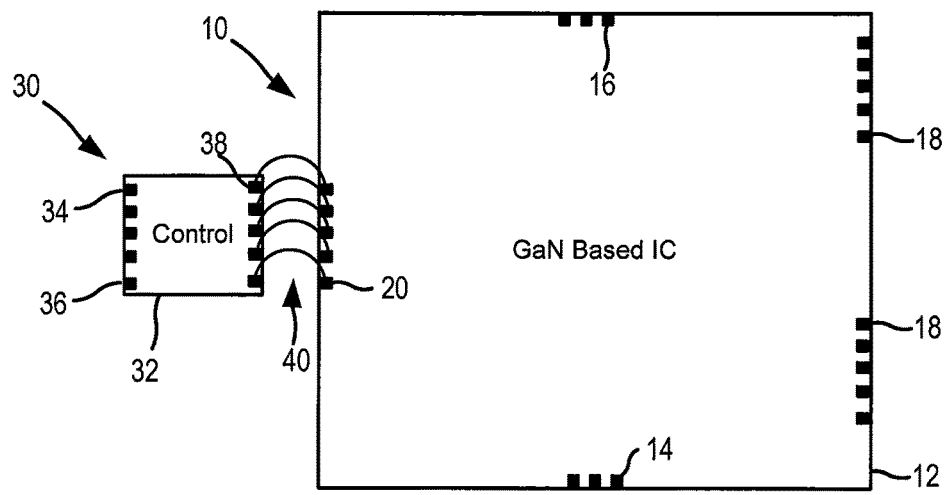
FIG. 1 is a schematic plan view of a conventional gallium nitride based power semiconductor device that is controlled using digital control signals supplied from external control circuit.

FIG. 1 is a schematic plan view of a conventional gallium nitride based power semiconductor device that is controlled using digital control signals. As shown in FIG. 1, a gallium nitride based integrated circuit chip 10 is provided. The gallium nitride based integrated circuit chip 10 may include a base substrate 12 such as, for example, a silicon carbide semiconductor substrate that has a plurality of gallium nitride based epitaxial layers formed thereon. Various input/output pads may be formed on the substrate 12 including, for example, RF input pads 14, RF output pads 16, bias signal pads 18 and control signal pads 20. A control circuit integrated circuit chip 30 may also be provided. The control circuit integrated circuit chip 30 may be implemented on a second semiconductor substrate 32, which may comprise, for example, a silicon substrate. Various input/output pads may be formed on the substrate 32 of the control circuit integrated circuit chip 30 including, for example, bias signal pads 34, control signal input pads 36 and control signal output pads 38. While FIG. 1 illustrates a single control circuit integrated circuit chip 30, it will be appreciated that a plurality of separate control circuit integrated circuit chips 30 may be needed to generate the necessary control signals, particularly if off-the-shelf digital circuits are used to form the control circuitry.

In some cases (such as the example of FIG. 1), the gallium nitride based integrated circuit chip 10 and the control circuit integrated circuit chip 30 may be mounted in a single package. As shown in FIG. 1, in such embodiments, a plurality of bond wires or other interconnections 40 may be provided that connect various output pads 38 included in control circuit integrated circuit chip 30 to input pads 20 included in the gallium nitride based integrated circuit chip 10. In other cases, the two integrated circuit chips 10, 30 may be packaged separately and interconnected, for example, via control lines on a printed circuit board and/or bond wires. In either case, interconnecting the two integrated circuit chips 10, 30 tends to add significant additional complexity and expense to the fabrication process, and also may reduce the performance of the device.

Pursuant to embodiments of the present invention, gallium nitride based MMIC devices are provided in which both an RF circuit and the control circuits that are used to generate digital control signals that control the operation of the RF circuit are formed on a single monolithic substrate. Typically, gallium nitride based RF circuits are formed using depletion mode (normally on) transistors. However, digital control circuits that are formed exclusively using depletion mode transistors are more difficult to design, require significantly more chip area to implement, and use more power as compared to digital control circuits that are implemented using a combination of enhancement mode and depletion mode transistors, or digital control circuits that are implemented exclusively using enhancement mode transistors. Consequently, digital control circuits have not been integrated into conventional gallium nitride based RF MMIC devices.

The gallium nitride based MMIC devices according to embodiments of the present invention may be smaller, cheaper and less complex as compared to conventional multi-chip circuits that provide the same functionality. Moreover, various performance advantages may be achieved by integrating the digital control circuitry into the gallium nitride based MMIC, including improved high temperature performance and faster operating speeds. Moreover, the gallium nitride based MMIC devices according to embodiments of the present invention may be fabricated using currently available tools and fabrication techniques.

In some embodiments, gallium nitride based MMIC devices are provided that include a gallium nitride based epitaxial structure that is formed on a substrate such as, for example, a silicon carbide substrate. The gallium nitride based epitaxial structure may include, for example, a gallium nitride based channel layer and a gallium nitride based barrier layer that is formed on the gallium nitride based channel layer opposite the substrate. Additional epitaxial layers may be included as part of either the gallium nitride base channel layer or the gallium nitride based barrier layer such as, for example, buffer layers, strain balancing layers, transition layers and the like. A plurality of depletion mode transistors may be formed on and in the gallium nitride based epitaxial structure. These depletion mode transistors may include a gate electrode, a source electrode and a drain electrode. These electrodes may be formed on the gallium nitride based barrier layer opposite the gallium nitride based channel layer and may be in direct contact with the gallium nitride based barrier layer.

Additionally, a plurality of enhancement mode transistors may be formed on and in the gallium nitride based epitaxial structure. The enhancement mode transistors may likewise include a gate electrode, a source electrode and a drain electrode. The source and drain electrodes may be formed on the gallium nitride based barrier layer and may be in direct contact with the gallium nitride based barrier layer. A portion of the gallium nitride based barrier layer that is between the source and drain electrodes may be etched away to form an opening in the barrier layer that exposes the channel layer. A gate insulating layer such as, for example, an oxide layer (e.g., $SiO_2$) may be formed in the opening, and the gate electrode may be formed on the gate insulating layer opposite the gallium nitride based channel layer and the gallium nitride based barrier layer.

In other embodiments, the enhancement mode transistors may have a different design in which the portion of the gallium nitride based barrier layer that is between the source and drain electrodes may only be partially etched away so that the opening formed in the gallium nitride based barrier layer does not expose the gallium nitride based channel layer. The gate electrode is formed in the opening in the gallium nitride based barrier layer.

In some embodiments, the depletion mode transistors may comprise "RF" depletion mode transistors that are configured to operate on radio frequency ("RF") signals, such as the transistors of a gallium nitride based HEMT RF amplifier. In some embodiments, the depletion mode transistors may additionally include "digital" depletion mode transistors that are part of a digital control circuit. The size and layout of the digital depletion mode transistors and the RF depletion mode transistors may be different. The enhancement mode transistors may be "digital" enhancement mode transistors that are part of the digital control circuit.

Embodiments of the present invention will now be described in greater detail with reference to FIGS. 2A-6.

FIG. 2A is a schematic cross-sectional view of three regions of a gallium nitride based MMIC device according to embodiments of the present invention that includes both depletion-mode and enhancement mode transistors. FIGS. 2B-2D are schematic plan views corresponding to the three cross-sectional regions illustrated in FIG. 2A.

Referring FIGS. 2A-2D, it can be seen that a gallium nitride based MMIC device 100 includes three different types of transistors, namely RF depletion mode transistors 200, digital depletion mode transistors 300 and digital enhancement mode transistors 400. While FIG. 2A only illustrates a single instance of each transistor 200, 300, 400 to simplify the drawing, it will be appreciated that typically the gallium nitride based MMIC device 100 will include multiple of each type of transistor 200, 300, 400. It will also be appreciated that the digital depletion mode transistor 300 may be omitted in some embodiments.

As shown in FIG. 2A, the RF depletion mode transistors 200, digital depletion mode transistors 300 and digital enhancement mode transistors 400 may all be formed on a monolithic substrate 110 such as, for example, a silicon carbide semiconductor substrate 110. For example, the substrate 110 may comprise a or 6H-SiC substrate. Silicon carbide has a much closer crystal lattice match to gallium nitride based materials than does sapphire ($Al_2O_3$), which is a very common substrate material for gallium nitride based devices. The closer lattice match of silicon carbide may result in gallium nitride based materials of higher quality than those generally available on sapphire. Silicon carbide also has a very high thermal conductivity so that the total output power of gallium nitride based devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like.

As shown in FIG. 2A, a gallium nitride based epitaxial structure 120 is formed on the substrate 110. The gallium nitride based epitaxial structure 120 may include a first group of one or more gallium nitride based layers 130. The first group of gallium nitride based layers 130 may include a gallium nitride based channel layer, such as $Al_xGa_{1-x}N$, where 0≤x<1. In certain embodiments of the present invention, the gallium nitride based channel layer may have the formula $Al_xGa_{1-x}N$, where x=0, indicating that the channel layer is a gallium nitride layer. However, it will be appreciated that in other embodiments the gallium nitride based channel layer may also be a different gallium nitride based layer such as InGaN, AlInGaN or the like. In an example embodiment, the gallium nitride based channel layer may be undoped or unintentionally doped and may be grown to a thickness of greater than about 20 Å. The gallium nitride based channel layer may also be a multi-layer structure, such as a superlattice, and may include combinations of GaN, AlGaN and the like. In some embodiments, the first group of gallium nitride based layers 130 may include a gallium nitride based channel layer and one or more additional layers such as, for example buffer, nucleation, transition and/or strain balancing layers. For example, an aluminum nitride buffer layer may be included to provide an appropriate crystal structure transition between the silicon carbide substrate and the remainder of the device. Herein, the first group of gallium nitride based layers 130 will be referred to as the gallium nitride based channel layer 130 regardless as to whether or not the first group of gallium nitride based layers only includes a gallium nitride based channel layer or also includes additional layers.

The gallium nitride based epitaxial structure 120 may further include a second group of one or more gallium nitride based layers 140. The second group of gallium nitride based layers 140 may include a gallium nitride based barrier layer, and may also include additional layers such as transition and/or strain balancing layers. Herein, the second group of gallium nitride based layers will be referred to as the gallium nitride based barrier layer 140 regardless as to whether or not the second group of gallium nitride based layers only includes a gallium nitride based barrier layer or also includes additional layers. A bandgap of a lower portion of the gallium nitride based barrier layer 140 that contacts the upper surface of the gallium nitride based channel layer 130 may exceed the bandgap of the uppermost layer of the gallium nitride based channel layer 130. Additionally, the gallium nitride based channel layer 130 may have a larger electron affinity than the gallium nitride based barrier layer 140. The energy of the conduction band edge of the gallium nitride based channel layer 130 is less than the energy of the conduction band edge of the gallium nitride based barrier layer 140 at the interface between the gallium nitride based channel and barrier layers 130, 140.

In certain embodiments, the gallium nitride based barrier layer 140 is AlN, AlInN, AlGaN or AlInGaN, or combinations of layers thereof, with a thickness of between about 0.1 nm and about 30 nm. In some embodiments of the present invention, the gallium nitride based barrier layer 140 is $Al_xGa_{1-x}N$ where 0<x<1. In particular embodiments, the aluminum concentration is about 25%. However, in other embodiments of the present invention, the gallium nitride based barrier layer 140 comprises AlGaN with an aluminum concentration of between about 5% and about 100%. In specific embodiments of the present invention, the aluminum concentration is greater than about 10%. In some embodiments, the gallium nitride based barrier layer 140 may be undoped or doped with an n-type dopant to a concentration less than about $10^{19}$ cm$^{-3}$. The gallium nitride based barrier layer 140 may be thick enough and have a high enough aluminum concentration to induce a significant carrier concentration at the interface between the gallium nitride based channel layer 130 and the gallium nitride based barrier layer 140. In an example embodiment, the uppermost portion of the gallium nitride based channel layer 130 may comprise gallium nitride, while the lowermost portion of the gallium nitride based barrier layer 140 may comprise aluminum gallium nitride.

As is further shown in FIG. 2A, the substrate 110 may include a first region 112 and a second region 114. The RF depletion mode transistors 200 may be formed in the first region 112 of the substrate 110, and the digital depletion mode transistors 300 and the digital enhancement mode transistors 400 may be formed in the second region 114 of the substrate 110.

Referring now to FIGS. 2A and 2B, each RF depletion mode transistor 200 includes a gate electrode 210, a source electrode 220 and a drain electrode 230. The gate electrode 210 may comprise a relatively narrow gate finger 210 that extends in parallel between the source electrode 220 and the drain electrode 230. The "gate width" of a transistor refers to the distance by which the gate finger 210 extends between or "overlaps" with its associated source and drain electrodes 220, 230. As shown in FIG. 2B, the gate width of the RF depletion mode transistors 200 may be relatively large. In the depicted embodiment, the width of the gate finger 210 of the RF depletion mode transistor is about 500 microns.

As is further shown in FIG. 2A, source/drain regions 142 may be formed in the gallium nitride based barrier layer 140 underneath the respective source and drain electrodes 220, 230. The source/drain regions 142 may extend into the gallium nitride based channel layer 130, as shown. The source/drain regions 142 may be doped (or more heavily doped) regions of the gallium nitride based barrier layer 140. The source/drain regions 142 may be formed, for example, by ion implantation. The source/drain regions 142 may have any suitable doping concentration. In an example embodiment, the source/drain regions 142 may have a doping concentration of about $1\times10^{20}$ to $1\times10^{21}$ cm$^3$. In other embodiments, the source/drain regions 142 may only extend part of the way rather than completely through the gallium nitride based barrier layer 140. In still other embodiments, the source/drain regions 142 may be omitted so that the source and drain electrodes 220, 230 are formed directly on the gallium nitride based barrier layer 140. The digital depletion mode transistors 300 and the digital enhancement mode transistors 400 that are discussed in more detail below may have any of the above-discussed configurations for the source/drain regions 142, including omitting the source/drain regions 142.

While not shown in the figures, it will be understood that a plurality of RF depletion mode transistors 200 may be provided in the first region 112 of the substrate 110. These RF depletion mode transistors 200 may comprise a plurality of unit cell transistors that are electrically connected to each other in parallel. Each unit cell transistor 200 may share a source electrode 220 and/or a drain electrode 230 with one or more adjacent unit cell transistors 200.

An insulating layer 150 is formed on a top surface of the gallium nitride based barrier layer 140. The insulating layer 150 may comprise, for example, a nitride layer such as a silicon nitride layer. The insulating layer 150 may serve as a passivation layer in some embodiments. The insulating layer 150 may additionally (or alternatively) insulate wings 212 that extend laterally from the upper portion of the gate electrode 210 from the gallium nitride based barrier layer 140. Openings are provided in the insulating layer 150 for the respective gate, source and drain electrodes 210, 220, 230. These openings expose the gallium nitride based barrier layer 140 so that the gate, source and drain electrodes 210, 220, 230 may directly contact a top surface of the gallium nitride based barrier layer 140.

The depletion mode transistors 200 may comprise HEMT transistors. Due to the difference in bandgap between the gallium nitride based barrier layer 140 and the gallium nitride based channel layer 130 and piezoelectric effects at the interface between the gallium nitride based barrier layer 140 and the gallium nitride based channel layer 130, a two dimensional electron gas (2DEG) is induced in the gallium nitride based channel layer 130 at a junction between the gallium nitride based channel layer 130 and the gallium nitride based barrier layer 140. The 2DEG acts as a highly conductive layer that allows conduction between source and drain regions of the depletion mode transistor 200 that are beneath the source electrode 220 and the drain electrode 230, respectively. The source electrode 220 and the drain electrode 230 may directly contact the barrier layer 140. The gate fingers 210 also may directly contact the gallium nitride based barrier layer 140 and are positioned between the source and drain electrodes 220, 230. While the gate fingers 210 and source and drain electrodes 220, 230 are all shown in FIG. 2A as having the same "length" (i.e., the distance that the electrodes extend in the X direction), it will be appreciated that in practice the gate fingers 210 have lengths that are substantially smaller than the lengths of the source and drain electrodes 220, 230, as can be seen in FIG. 2B. It will also be appreciated that the source and drain electrodes 220, 230 need not have the same lengths.

The gate finger 210 may comprise a metal gate finger in some embodiments. The particular material(s) used to form the gate finger 210 may be chosen based on, for example, the composition of the gallium nitride based barrier layer 140. In example embodiments, the gate finger 210 may comprise one or more of Ni, Pt and Au. The source and drain electrodes 220, 230 may include one or more metals such as Ti, Ni and Pt. In an example embodiment, the source and drain electrodes 220, 230 may comprise a Ti/Si/Ni/Pt stack. The source and drain electrodes 220, 230 may form ohmic contacts to the gallium nitride based barrier layer 140. The gate electrode 210 may be closer to the source electrode 220 than it is to the drain electrode 230, as is shown in FIG. 2B.

As is further shown in FIGS. 2A and 2B, a spacer layer 240 may be formed on top of the gate electrode 210 and on top portions of the insulating layer 150. A field plate 250 may be formed on top of the spacer layer 240. The field plate 250 may vertically overlap both a portion of the gate electrode 210 and a portion of the semiconductor structure 120 that is between the gate electrode 210 and the drain electrode 230. The field plate 250 is electrically isolated from both the gate electrode 210 and portion of the semiconductor structure 120 that the field plate 250 vertically overlaps. The field plate 250 may be connected to the source electrode 220 via an electrical connection that is not shown in the figures. The field plate 250 is a conductive plate that redistributes the electric field on the drain side of the transistor 200 in order to improve the breakdown voltage, gain, and maximum operating frequency of the device.

FIGS. 2A and 2C illustrate the design of the digital depletion mode transistor 300. The digital depletion mode transistor 300 may have similar layers and regions as the RF depletion mode transistor 200, but the sizes of the various regions may be quite different. As shown in FIGS. 2A and 2C, the digital depletion mode transistor 300 includes a gallium nitride based channel layer 130 that is formed on a substrate 110, and a gallium nitride based barrier layer 140 that is on the gallium nitride based channel layer 130 opposite the substrate 110. The gallium nitride based barrier layer 140 may include source/drain regions 142. A gate electrode 310, a source electrode 320 and a drain electrode 330 are formed on the gallium nitride based barrier layer 140. The gate electrode 310 extends in parallel between the source electrode 320 and the drain electrode 330.

The above discussed insulating layer 150 (e.g., a silicon nitride insulating layer) is also formed on a top surface of the gallium nitride based barrier layer 140 in the second region 114 of the substrate 110. The gate, source and drain electrodes 310, 320, 330 are formed in respective openings in the insulating layer 150. The depletion mode transistors 300 may, like the depletion mode transistor 200, comprise a HEMT transistor and may operate in the same fashion as the depletion mode transistor 200 discussed above.

As shown in FIG. 2C, the gate width of the digital depletion mode transistor 300 may be orders of magnitude smaller than the gate width of the RF depletion mode transistor 200. In the depicted embodiment, the width of the gate electrode 310 of the digital depletion mode transistor is about 3 microns, compared to a gate width of about 500 microns for the RF depletion mode transistor 200. In the depicted embodiment, the length of the gate electrode 310 of the digital depletion mode transistor is about 6-7 microns, compared to a gate length of about 0.1-0.5 microns for the RF depletion mode transistor 200. As is also shown in FIG. 2C, the gate width of each of the depletion mode transistors 300 may be about half the gate length thereof in an example embodiment. The gate, source and drain electrodes 310, 320, 330 may be formed of the same materials as the corresponding materials used to form the gate, source and drain electrodes 210, 220, 230 of depletion mode transistor 200. The field plates 250 that are included in the depletion mode transistors 200 may be omitted in the depletion mode transistors 300. Additionally, the gate electrode 310 may be located substantially equidistant from the source electrode 320 and the drain electrode 330 in the depletion mode transistors 300.

Referring next to FIGS. 2A and 2D, each digital enhancement mode transistor 400 includes a gate electrode 410 that is positioned between a source electrode 420 and a drain electrode 430. The gate width of the digital enhancement mode transistor 400 may be several orders of magnitude smaller than the gate width of the RF depletion mode transistors 200, and may be about the same as the gate width of the digital depletion mode transistors 300. The gate length of the digital enhancement mode transistor 400 may be an order of magnitude smaller than the gate length of the digital depletion mode transistor 300.

The digital enhancement mode transistor 400 may be similar to the digital depletion mode transistor 300 described above, but may have a different gate electrode design. In particular, referring first to FIG. 2A, it can be seen that a recess 412 is formed in the gallium nitride based barrier layer 140, and the gate electrode 410 extends into the recess 412. The recess 412 may extend completely through the gallium nitride based barrier layer 140, and may extend into the gallium nitride based channel layer 130 in some embodiments. For example, in some embodiments, the recess 412 may extend between 1 nm and 15 nm into the gallium nitride based channel layer 130. A gate insulating layer 414 is formed in the recess 412. The gate insulating layer 414 may cover the exposed sidewalls of the gallium nitride based barrier layer 140 as well as the exposed top surface of the gallium nitride based channel layer 130 in order to isolate the gate electrode 410 from the gallium nitride based channel layer 130. The modified gate electrode configuration causes the transistor 400 to operate as an enhancement mode device. Advantageously, the enhancement mode transistor 400 may be formed using the same general processing steps used to form the depletion mode transistors 200, 300, allowing both depletion mode and enhancement mode transistors to be readily formed on the same substrate.

The digital enhancement mode transistor 400 may have a gate width that is similar to the gate width of the digital depletion mode transistor 300 in some embodiments. For example, the gate width of each digital enhancement mode transistor 400 may be about 2-6 microns. The gate length of each digital enhancement mode transistor 400 may be smaller than the gate lengths of the digital depletion mode transistors. For example, the gate length of each digital enhancement mode transistor 400 may be less than 1 micron.

The RF depletion mode transistors 200 are typically implemented as "unit cell" transistors, where a plurality of individual "unit cell" transistors are formed that are electrically connected in parallel so as to operate as a single transistor. Many unit cells may be provided to increase the current carrying capacity and voltage blocking capabilities of the device. In contrast, the digital depletion mode transistors 300 and the digital enhancement mode transistors 400 are typically implemented as stand-alone transistors since these transistors pass much smaller current levels.

In some embodiments, the RF depletion mode transistors 200 may comprise an RF power amplifier, and the digital depletion mode transistors 300 and the digital enhancement mode transistors 400 may be arranged to form digital control circuits that gate the RF signal that is input to the RF power amplifier. The digital depletion mode transistors 300 and the digital enhancement mode transistors 400 may be low voltage devices that generate relatively low electric fields.

The gallium nitride based MMIC devices according to embodiments of the present invention may exhibit a number of advantages. For example, RF transistors and digital control transistors may be formed on a common substrate, allowing transmission lines that connect the digital control circuits to the RF circuit to be formed on the common substrate. This may avoid the need, and the associated cost, for interconnecting multiple chips via wire bonding or other techniques. As such, the gallium nitride based MMIC devices according to embodiments of the present invention may be smaller, cheaper and less complex as compared to conventional multi-chip circuits that provide the same functionality. Moreover, the devices according to embodiments of the present invention may have much shorter control lines and hence may exhibit improved performance. Additionally, by fabricating the digital transistors 300, 400 as gallium nitride based transistors the high temperature performance and over all robustness of the circuit may be improved. Moreover, the digital enhancement mode transistors 400 may be formed using substantially the same process steps that are used to form the depletion mode transistors 200, 300, allowing the same processing equipment to be used to form all three types of transistors on the common substrate. Fabrication of the enhancement mode transistors 400 may require the additional steps of forming the recess 412 in the gallium nitride based barrier layer 140 and forming the gate insulating layer 414 in the second region of the substrate 110, but these are both standard processing steps that may readily be incorporated into the manufacturing process.

The gallium nitride based enhancement mode transistor as shown in FIGS. 2A and 2D has a non-traditional design that may not represent the ideal way to fabricate a gallium nitride based enhancement mode transistor. However, this design exhibits certain advantages when used to form a gallium nitride based MMIC device that has integrated control circuitry, as the enhancement mode transistor may readily be fabricated during the processing steps used to form the RF transistors.

Figure 3:
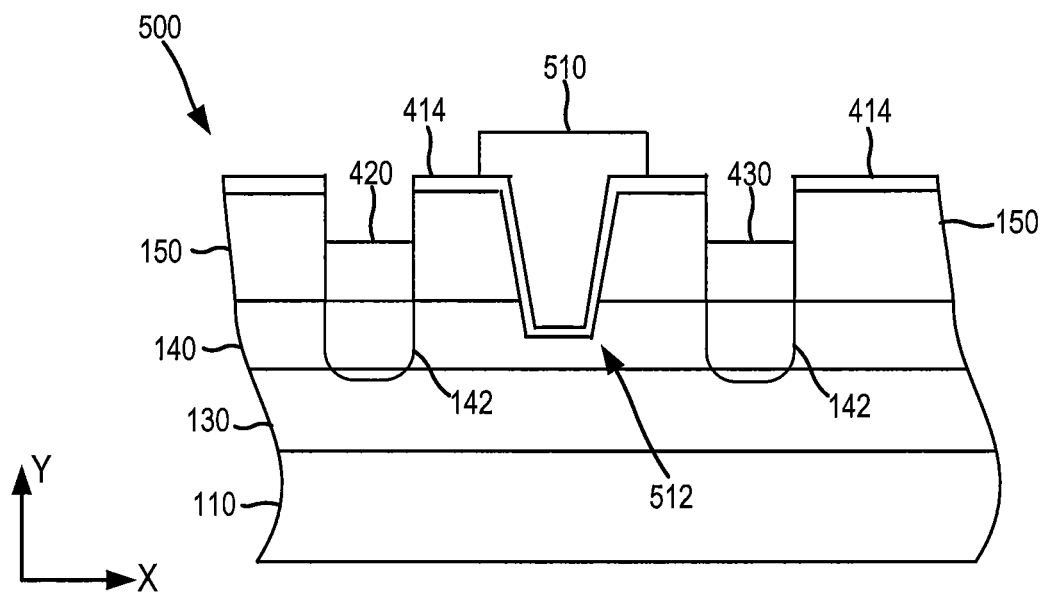
FIG. 3 is a cross-sectional view of an alternative enhancement mode transistor design that may be used in gallium nitride based MMIC devices according to embodiments of the present invention.
Figure 4:
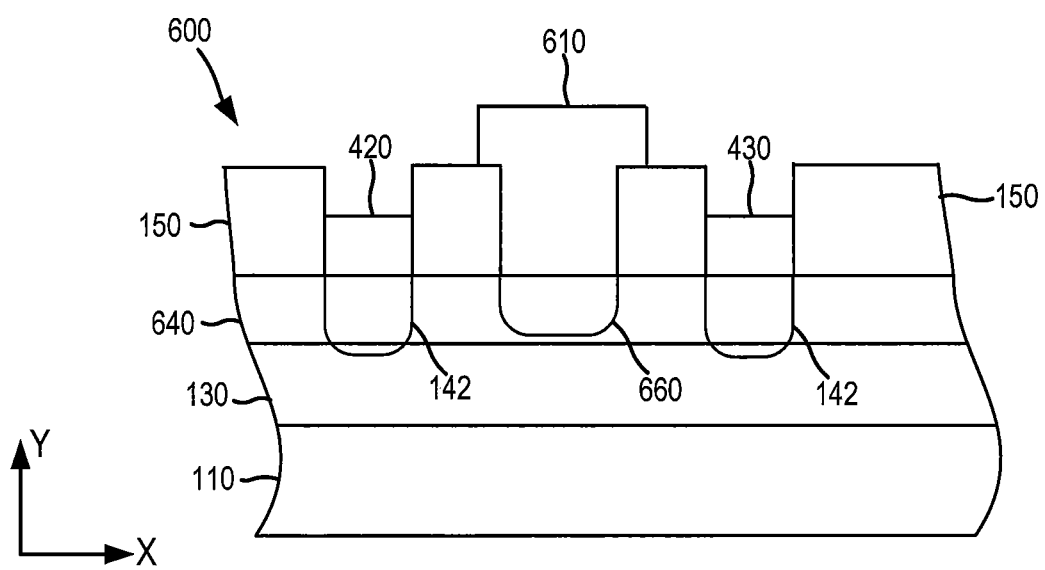
FIG. 4 is a cross-sectional view of another alternative enhancement mode transistor design that may be used in gallium nitride based MMIC devices according to embodiments of the present invention.

Pursuant to further embodiments of the present invention, gallium nitride based MMIC devices may be provided that include enhancement mode transistors that have alternative designs. FIGS. 3 and 4 illustrate two alternate enhancement mode transistor designs that may be used in gallium nitride based MMIC devices according to embodiments of the present invention. The enhancement mode transistor designs illustrated in FIGS. 3 and 4 may be used in place of the enhancement mode transistor 400 of FIG. 2A.

FIG. 3 is a cross-sectional view of an alternative enhancement mode transistor 500 that may be used in gallium nitride based MMIC devices according to embodiments of the present invention. As can be seen by comparing FIG. 3 to FIG. 2A, the enhancement mode transistor 500 may be similar to the enhancement mode transistor 400 that is described above, but the enhancement mode transistor 500 includes a recess 512 that does not extend completely through the gallium nitride based barrier layer 140. The gate electrode 510 is formed in the recess 512 to cover the sidewalls of the recess 512 and the bottom surface of the recess 512.

In the enhancement mode transistor 500, a gate insulating layer 414 may optionally be provided, as it may increase the forward gate voltage of the device. However, it will be appreciated that the gate insulating layer 414 may be omitted in other embodiments as the remaining portion of the gallium nitride based barrier layer 140 may prevent the gate electrode 510 from forming a short circuit with the gallium nitride based channel layer 130. In embodiments that include the gate insulating layer 414, the gate insulating layer 414 may be a high dielectric constant material (i.e., a material having a dielectric constant that is higher than the dielectric constant of silicon oxide) such as, for example, aluminum oxide, halfnium oxide, zirconium oxide or any other appropriate high dielectric constant material. The gate electrode 510 may include nickel oxide in some embodiments, which may advantageously increase the threshold voltage of the enhancement mode transistor 500.

Figure 6:
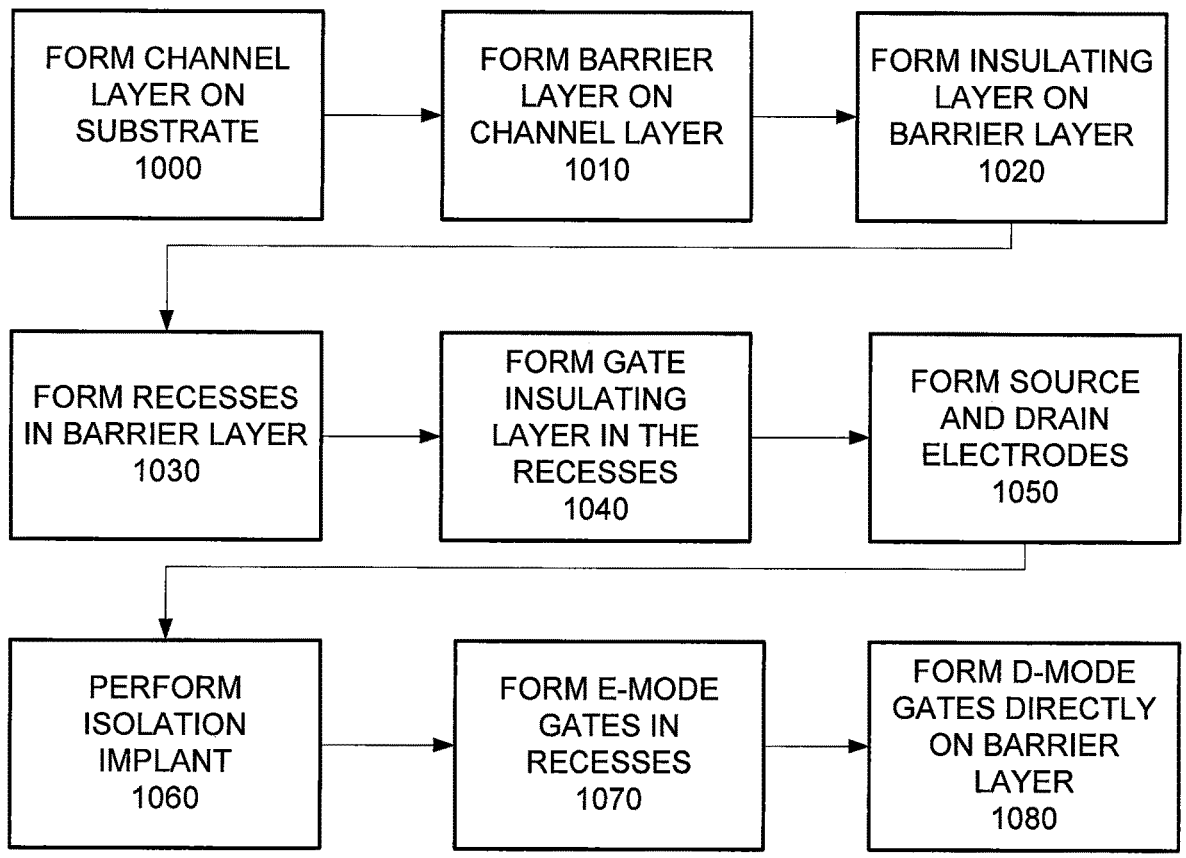
FIG. 6 is a flow chart describing a method of fabricating a gallium nitride based MMIC device according to certain embodiments of the present invention.

FIG. 4 is a cross-sectional view of another alternative enhancement mode transistor 600 that may be used in gallium nitride based MMIC devices according to still further embodiments of the present invention. As shown in FIG. 6, the enhancement mode transistor 600 has a somewhat different design than the enhancement mode transistor 400 of FIGS. 2A and 2D. In particular, the enhancement mode transistor 600 does not include a recess in the gallium nitride barrier layer 640, and also does not include any gate insulating layer. The gallium nitride based barrier layer 640 of enhancement mode transistor 600, however, does include a doped region 660 underneath the gate electrode 610 that is doped with second conductivity type dopants. For example, if the source/drain regions 142 in the gallium nitride based barrier layer 640 are doped with n-type dopants, then the doped region 660 may be doped with p-type dopants. The doped region 660 may be formed, for example, by ion implantation. In an example embodiment, the doped region 660 may be doped with p-type dopants such as magnesium. For example, an 8 keV implant may be performed at a dose of $2 \times 10^{13}$ cm$^{-2}$.

Figure 5A:
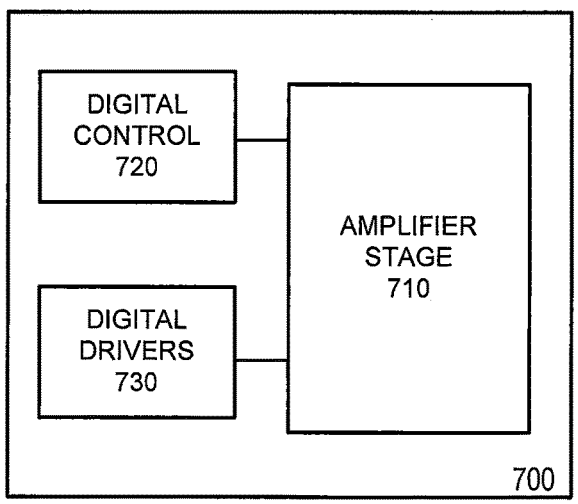
FIGS. 5A-5C are schematic plan views of gallium nitride based MMIC devices according to various embodiments of the present invention.
Figure 5B:
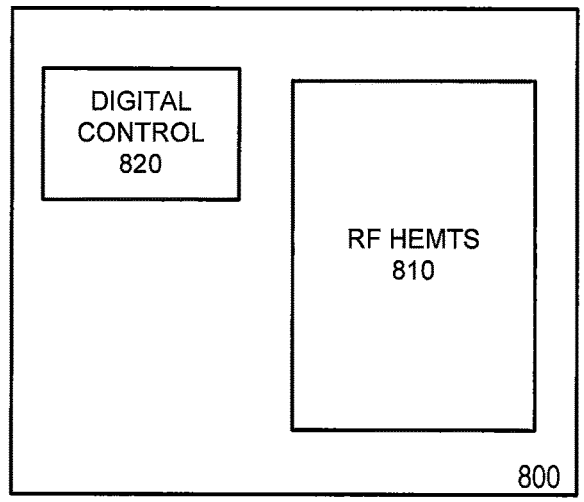
Figure 5C:
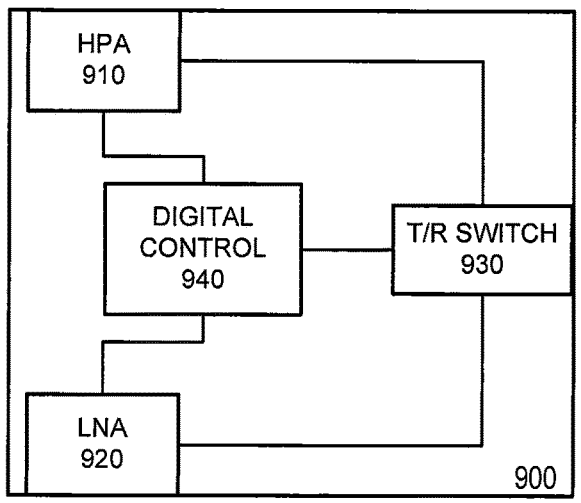

FIGS. 5A-5C are schematic plan views of gallium nitride based MMIC devices according to various embodiments of the present invention.

Referring first to FIG. 5A, a MMIC digital power amplifier 700 is illustrated that includes an amplifier stage 710 that is formed using unit cell RF depletion mode transistors, a digital control block 720 that is formed using a combination of digital depletion mode and digital enhancement mode transistors, and a digital driver circuitry 730 that is formed using a combination of digital depletion mode and digital enhancement mode transistors. The MMIC digital power amplifier 700 may operate as a switching amplifier in which the amplification transistors thereof spend little time in the linear region (i.e., the transistors are either fully on or fully off), which may allow the power amplifier 700 to achieve very high efficiency levels (e.g., greater than 90%).

FIG. 5B is a schematic plan view of an integrated circuit 800 including an RF transistor 810 and control circuitry 820 that includes both enhancement mode and depletion mode transistors. The control circuitry 820 modulates, limits or otherwise controls the bias of the RF transistor 810 in order to affect the linearity, temperature response, gain response or other performance parameters of the RF transistor 810.

FIG. 5C is a schematic plan view of a MMIC transmit/receive circuit 900 that is suitable for use in a time division duplex communication system that transmits and receives signals using the same frequency band. As shown in FIG. 5C, the MMIC transmit/receive circuit 900 includes a high power amplifier circuit 910, a low noise amplifier circuit 920, a transmit/receive switch 930 and a digital control block 940. The high power amplifier circuit 910 and the low noise amplifier circuit 920 may each be implemented using unit cell RF depletion mode transistors. The control block 940 may include, for example, bias control circuits for the high power amplifier 910 and/or for the low noise amplifier 920, and may further include digital control circuits for controlling operation of the transmit/receive switch 930. The control block 940 may be implemented, for example, using digital depletion mode and digital enhancement mode transistors.

FIG. 6 is a flow chart illustrating a method of fabricating a gallium nitride based MMIC device according to certain embodiments of the present invention. As shown in FIG. 6, operations may begin with a gallium nitride based channel layer being formed on a monolithic substrate (block 1000). The monolithic substrate may comprise, for example, a silicon carbide wafer, and the gallium nitride based channel layer may comprise a single layer or multiple layers of gallium nitride based materials. Next, a gallium nitride based barrier layer may be formed on the gallium nitride based channel layer opposite the substrate (block 1010). The gallium nitride based barrier layer may comprise a single layer or multiple layers, and a bandgap of a lower portion of the gallium nitride based barrier layer is greater than a bandgap of an upper portion of the gallium nitride based channel layer that is immediately adjacent the gallium nitride based barrier layer.

Next, an insulating layer is formed on the gallium nitride based barrier, the insulating layer including a plurality of first, second and third gate electrode openings and a plurality of source/drain electrode openings that expose the gallium nitride based barrier layer (block 1020). Then, a plurality of recesses are formed in the gallium nitride based barrier layer in the first gate electrode openings (block 1030). A gate insulating layer is formed in the first gate electrode openings, the gate insulating layer covering sidewalls and bottom surfaces of the respective recesses (block 1040). The gate insulating layer may also cover portions of the top surface of the insulating layer.

A plurality of first source electrodes, a plurality of second source electrodes, a plurality of first drain electrodes and a plurality of second drain electrodes are formed in the source/drain electrode openings in the insulating layer so that the first source electrodes, the second source electrodes, the first drain electrodes and the second drain electrodes directly contact a top surface of the gallium nitride based barrier layer (block 1050). Then, an isolation implant process may be performed (block 1060). First gate electrodes are formed in the first gate electrode openings on the gate insulating layer, each first gate electrode extending into a respective one of the recesses (block 1070). Second gate electrodes are formed in the second gate electrode openings in the insulating layer, the second gate electrodes directly contacting a top surface of the gallium nitride based barrier layer (block 1080). Each set of a first source electrode, a first drain electrode and a first gate electrode comprise the electrodes of an enhancement mode transistor, and each set of a second source electrode, a second drain electrode and a second gate electrode comprise the electrodes of a depletion mode transistor.

It will be appreciated that the digital enhancement mode transistors (and the digital depletion mode transistors) may be used to implement a variety of different circuits, such as digital control circuitry, digital logic, and digital RF drivers.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A monolithic microwave integrated circuit, comprising:
   a monolithic substrate;
   a gallium nitride based channel layer on the monolithic substrate;
   a gallium nitride based barrier layer on the gallium nitride based channel layer opposite the monolithic substrate, the gallium nitride based barrier layer including a recess that extends completely through the gallium nitride based barrier layer to expose the gallium nitride based channel layer;
   a depletion mode transistor having a first gate electrode that has a bottom surface that is in direct contact with the gallium nitride based barrier layer;
   an insulating layer in the recess; and
   an enhancement mode transistor having a second gate electrode that is on the insulating layer and that extends into the recess.

2. The monolithic microwave integrated circuit of claim 1, wherein the recess extends completely through the gallium nitride based barrier layer.

3. The monolithic microwave integrated circuit of claim 2, wherein the recess further extends into a top surface of the gallium nitride based channel layer.

4. The monolithic microwave integrated circuit of claim 1, wherein a first distance between the second gate electrode and a source electrode of the enhancement mode transistor is substantially the same as a second distance between the second gate electrode and a drain electrode of the enhancement mode transistor, and wherein a third distance between the first gate electrode and a source electrode of the depletion mode transistor is less than a fourth distance between the first gate electrode and a drain electrode of the depletion mode transistor.

5. The monolithic microwave integrated circuit of claim 1, wherein the depletion mode transistor includes a field plate and the enhancement mode transistor does not include a field plate.

6. The monolithic microwave integrated circuit of claim 1, wherein the insulating layer comprises an oxide layer.

7. The monolithic microwave integrated circuit of claim 1, wherein the depletion mode transistor has a first gate width that exceeds a second gate width of the enhancement mode transistor by at least a factor of ten.

8. A semiconductor integrated circuit, comprising:
   a monolithic substrate;
   a gallium nitride based barrier layer on the monolithic substrate that includes a plurality of recesses in a top surface thereof,
   a radio frequency (RF) power amplifier formed on a first region of the monolithic substrate, the RF power amplifier including a plurality of gallium nitride based depletion mode transistors; and
   a digital circuit formed on a second region of the monolithic substrate, the digital circuit including a plurality of gallium nitride based enhancement mode transistors,
   an insulating layer interposed between the gallium nitride based barrier layer and respective gate electrodes of the gallium nitride based enhancement mode transistors.

9. The semiconductor integrated circuit of claim 8, wherein the insulating layer comprises an oxide layer.

10. The semiconductor integrated circuit of claim 8, wherein the digital circuit further includes a plurality of gallium nitride based depletion mode transistors.

11. The semiconductor integrated circuit of claim 8, wherein the recesses extend completely through the gallium nitride based barrier layer.

12. The semiconductor integrated circuit of claim 8, wherein each gallium nitride based enhancement mode transistor further includes a source electrode and a drain electrode, and wherein the gate electrode of each gallium nitride based enhancement mode transistor is equidistant between its corresponding source and drain electrodes.

13. The semiconductor integrated circuit of claim 12, wherein each gallium nitride based depletion mode transistor includes a gate electrode, a source electrode and a drain electrode, and wherein the gate electrode of each gallium nitride based depletion mode transistor is closer to its corresponding source electrode than it is to its corresponding drain electrode.

14. The semiconductor integrated circuit of claim 8, wherein the gallium nitride based barrier layer is doped with first conductivity type dopants under source and drain electrodes of each gallium nitride based enhancement mode transistor.

15. A semiconductor integrated circuit, comprising:
   an epitaxial structure that includes a plurality of recesses in a top surface thereof,
   a radio frequency (RF) power amplifier in a first region of the epitaxial structure, the RF power amplifier including a plurality of gallium nitride based depletion mode transistors; and
   a digital circuit in a second region of the epitaxial structure, the digital circuit including a plurality of gallium nitride based enhancement mode transistors and a plurality of gallium nitride based depletion mode transistors,
   wherein gate electrodes of the gallium nitride based enhancement mode transistors in the second region of the epitaxial structure directly contact sidewalls and bottom surfaces of the respective recesses.

16. The semiconductor integrated circuit of claim 15, wherein the gate electrodes of the gallium nitride based enhancement mode transistors are closer to the a bottom surface of the epitaxial structure than are gate electrodes of the gallium nitride based depletion mode transistors that are in the digital circuit.

17. The semiconductor integrated circuit of claim 16, wherein the gate electrodes of the gallium nitride based enhancement mode transistors are closer to the a bottom surface of the epitaxial structure than are gate electrodes of the gallium nitride based depletion mode transistors that are in the RFR Power amplifier.

18. The semiconductor integrated circuit of claim 15, wherein each gallium nitride based enhancement mode transistor further includes a source electrode and a drain electrode, and wherein the gate electrode of each gallium nitride based enhancement mode transistor is equidistant between its corresponding source and drain electrodes.

19. The semiconductor integrated circuit of claim 18, wherein each gallium nitride based depletion mode transistor in the digital circuit includes a gate electrode, a source electrode and a drain electrode, and wherein the gate electrode of each gallium nitride based depletion mode transistor in the digital circuit is closer to its corresponding source electrode than it is to its corresponding drain electrode.

20. The semiconductor integrated circuit of claim 15, wherein the gallium nitride based depletion mode transistors in the RF amplifier have a first gate width that exceeds a second gate width of the gallium nitride based depletion mode transistors in the digital circuit by at least a factor of ten.

\* \* \* \* \*

UNITED STATES PATENT AND TRADEMARK OFFICE
CERTIFICATE OF CORRECTION

PATENT NO. : 10,861,963 B2
APPLICATION NO. : 16/663843
DATED : December 8, 2020
INVENTOR(S) : Sriram et al.

Page 1 of 1

It is certified that error appears in the above-identified patent and that said Letters Patent is hereby corrected as shown below:

In the Specification

Column 8, Line 47: Please correct "a or 6H-SiC" to read -- a 4H-SiC or 6H-SiC --

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*